(12) United States Patent
Holliday et al.

(10) Patent No.: US 11,494,527 B2
(45) Date of Patent: Nov. 8, 2022

(54) PAINT DESIGN TEMPLATE PRODUCTION AND ASSOCIATED SYSTEMS AND METHODS

(71) Applicant: The Boeing Company, Chicago, IL (US)

(72) Inventors: James Holliday, Moncks Corner, SC (US); Ronald J. Steckman, Johns Island, SC (US); William Joos, Ladson, SC (US); Andrew Figuracion, Snohomish, WA (US); Jason Dill, Stanwood, WA (US); Wayne Curtice, Jr., Bothell, WA (US); James Kotlik, Bothell, WA (US)

(73) Assignee: The Boeing Company, Chicago, IL (US)

( * ) Notice: Subject to any disclaimer, the term of this patent is extended or adjusted under 35 U.S.C. 154(b) by 89 days.

(21) Appl. No.: 16/820,490

(22) Filed: Mar. 16, 2020

(65) Prior Publication Data

US 2021/0286911 A1    Sep. 16, 2021

(51) Int. Cl.
*B05C 17/06*     (2006.01)
*G06F 30/12*     (2020.01)
(Continued)

(52) U.S. Cl.
CPC .............. *G06F 30/12* (2020.01); *B05C 17/06* (2013.01); *B41N 1/24* (2013.01);
(Continued)

(58) Field of Classification Search
CPC ..... G06F 30/12; G06F 3/13; G03G 15/04027; G06K 15/22; B05C 17/06; B41N 1/24; B41M 1/12
See application file for complete search history.

(56) References Cited

U.S. PATENT DOCUMENTS 7,683,916 B2 *   3/2010   Bossut .................... G06T 11/60
                                                          382/199
11,267,153 B2 *  3/2022   Rivers ................ B23Q 17/2233

FOREIGN PATENT DOCUMENTS

CN       105374256       3/2016
CN       108170904       6/2018

OTHER PUBLICATIONS

Extended European Search Report for EP Patent Application No. 21162978.7 dated Sep. 8, 2021.

* cited by examiner

*Primary Examiner* — Matthew G Marini
*Assistant Examiner* — Marissa Ferguson-Samreth
(74) *Attorney, Agent, or Firm* — Kunzler Bean & Adamson

(57) ABSTRACT

Disclosed herein are a system and method for producing paint templates for painting a design on a target surface. The system includes a processor configured to generate a geo-file of paint template designs. The processor includes a design module configured to parse the design into a set of paint sub-designs and a template design module configured to generate the geo-file of paint template designs based on the set of paint sub-designs. The generated geo-file of paint template designs includes a paint template design that corresponds to a paint sub-design. The system further includes a plotter configured to produce a set of paint templates based on the geo-file of paint template designs. Each paint template design includes a set of alignment marks and each paint template is produced with a set of alignment apertures corresponding to the set of alignment marks.

20 Claims, 12 Drawing Sheets

(51) Int. Cl.
*B41N 1/24* (2006.01)
*G06F 3/00* (2006.01)
*G06F 3/01* (2006.01)
*G06F 3/13* (2006.01)
*G03G 15/04* (2006.01)
*B05B 12/24* (2018.01)
*B41M 1/12* (2006.01)

(52) U.S. Cl.
CPC .......... *G03G 15/04027* (2013.01); *G06F 3/00* (2013.01); *G06F 3/01* (2013.01); *G06F 3/13* (2013.01); *B05B 12/24* (2018.02); *B41M 1/12* (2013.01)

PROCESSOR 210B

DESIGN MODULE
302

TEMPLATE DESIGN MODULE
304

COMMUNICATION MODULE
306

FIG. 3B

TEMPLATE DESIGN MODULE 304

ALIGNMENT MARK MODULE 402

ALIGNMENT MODULE 404

PART GEOMETRY MODULE 406

TEMPLATE GEOMETRY MODULE 408

FIG. 4

PLOTTER 104A

I/O INTERFACE
502

STORAGE DEVICE 208

PAINT SUB-TEMPLATE(S)
514

PROCESSOR 506A

TEMPLATE MODULE
508A

CUTTING COMPONENT
510

FIG. 5A

PLOTTER 104B

I/O INTERFACE 502

STORAGE DEVICE 208
PAINT SUB-TEMPLATE(S) 514

PROCESSOR 506B
TEMPLATE MODULE 508B

CUTTING COMPONENT 510

SCRIBE COMPONENT 512

FIG. 5B

PAINT DESIGN TEMPLATE PRODUCTION AND ASSOCIATED SYSTEMS AND METHODS

FIELD

This disclosure relates generally to painting a design on a component target surface and, more particularly, to systems and methods for producing paint templates utilized to facilitate painting a design on the target surface of a component.

BACKGROUND

Designs and/or logos are painted on target surfaces of many parts or structures. For example, aircraft often include a design or logo painted on a target surface of the fuselage. Some paint designs include multiple layers of paint that blend multiple colors and/or transition from one color to another color.

Multiple paint templates are utilized to apply the multiple layers of paint on a target surface. Generally, a set of ordered paint templates are designed and utilized to facilitate painting the paint design on the target surface. To begin the painting process, an initial paint template is utilized to facilitate applying a first paint layer on the target surface. Subsequent paint templates are then utilized to apply subsequent paint layers over and/or adjacent to one or more previous paint layers. This process continues until painting the design is completed.

Conventional systems and methods for generating a paint template design and/or producing a paint template are performed manually. Manual generation of the paint template design and/or paint template production is a relatively slow and/or costly process. In addition, inconsistencies can arise between two different paint template designs and/or paint templates because of human error and/or the differences between the individual(s) that manually generate the paint template designs and/or paint templates.

SUMMARY

The subject matter of the present disclosure provides examples of paint design template production and corresponding systems and methods that overcome the above-discussed shortcomings of prior art techniques. There is a desire to reduce the amount of time it takes to generate a design for a paint template and/or to produce the paint template. It would therefore be desirable to develop an improved system and method for generating a design for a paint template and/or producing the paint template that reduces the amount of time and costs involved in manufacturing of an aircraft. Accordingly, the subject matter of the present application has been developed in response to the present state of the art, and in particular, in response to shortcomings of conventional paint template designs and paint templates, and the conventional methods and systems for producing paint templates utilized to facilitate painting a design on the target surface of a component.

Disclosed herein is a system for producing paint templates for painting a design on a target surface. The system includes a processor configured to generate a geo-file of paint template designs. The processor includes a design module configured to parse the design into a set of paint sub-designs and a template design module configured to generate the geo-file of paint template designs based on the set of paint sub-designs. The generated geo-file of paint template designs comprising a paint template design that corresponds to a paint sub-design. The system further includes a plotter coupled to the processor and configured to produce a set of paint templates based on the geo-file of paint template designs. Each paint template design includes a set of alignment marks for facilitating painting the paint design on the target surface and each paint template is produced with a set of alignment apertures corresponding to the set of alignment marks for each respective paint template design. The preceding subject matter of this paragraph characterizes example 1 of the present disclosure.

The template design module is configured to generate the geo-file of paint template designs with a predetermined order for each paint template design relative to other paint template designs. The template design module comprises an alignment module configured to orient the set of alignment marks on each respective paint template design. The preceding subject matter of this paragraph characterizes example 2 of the present disclosure, wherein example 2 also includes the subject matter according to example 1, above.

The plotter includes a cutting component configured to form the set of alignment apertures from each respective paint template based on the corresponding set of alignment marks. The preceding subject matter of this paragraph characterizes example 3 of the present disclosure, wherein example 3 also includes the subject matter according to example 2, above.

The alignment module includes a part geometry module for a set of parts associated with the target surface and the alignment module is configured to orient the set of alignment marks on a first paint template design based on a first geometry for one or more parts in the set of parts associated with the target surface. The preceding subject matter of this paragraph characterizes example 4 of the present disclosure, wherein example 4 also includes the subject matter according to any one of examples 2 or 3, above.

The alignment module further includes a template geometry module. The template geometry module includes geometry data for each paint template design and the alignment module is further configured to orient the set of alignment marks on a second paint template design based on a second geometry for the set of alignment marks on the first paint template design. The preceding subject matter of this paragraph characterizes example 5 of the present disclosure, wherein example 5 also includes the subject matter according to example 4, above.

The alignment module further includes a template geometry module. The template geometry module includes geometry data for each paint template design and the alignment module is configured to orient the set of alignment marks on a current paint template design based on a geometry for the set of alignment marks on a previous paint template design. The preceding subject matter of this paragraph characterizes example 6 of the present disclosure, wherein example 6 also includes the subject matter according to any one of examples 2-5, above.

The set of alignment marks on the current paint template design includes a first alignment mark that is different than a second alignment mark on the previous paint template design. The preceding subject matter of this paragraph characterizes example 7 of the present disclosure, wherein example 7 also includes the subject matter according to example 6, above.

Further disclosed herein is an apparatus for generating a geo-file of paint template designs for producing paint templates that facilitate painting a design on a target surface. The apparatus includes a design module configured to parse a paint design into a set of paint sub-designs and a template design module configured to generate the geo-file of paint template designs based on the set of paint sub-designs. The generated geo-file of paint template designs includes a paint template design that corresponds to a paint sub-design. Each paint template design includes a set of alignment marks for facilitating painting the paint design on the target surface. The apparatus further includes a communication module coupleable to a plotter and configured to transmit the generated geo-file of paint template designs to the plotter. The preceding subject matter of this paragraph characterizes example 8 of the present disclosure.

The template design module is configured to generate the geo-file of paint template designs with a predetermined order for each paint template design relative to other paint template designs and the template design module includes an alignment module configured to orient the set of alignment marks on each respective paint template design. The preceding subject matter of this paragraph characterizes example 9 of the present disclosure, wherein example 9 also includes the subject matter according to example 8, above.

The alignment module includes a part geometry module for a set of parts associated with the target surface and the alignment module is configured to orient the set of alignment marks on a first paint template design based on a first geometry for one or more parts in the set of parts associated with the target surface. The preceding subject matter of this paragraph characterizes example 10 of the present disclosure, wherein example 10 also includes the subject matter according to example 9, above.

The alignment module further includes a template geometry module, the template geometry module including geometry data for each paint template design and the alignment module is further configured to orient the set of alignment marks on a second paint template design based on a second geometry for the set of alignment marks on the first paint template design. The preceding subject matter of this paragraph characterizes example 11 of the present disclosure, wherein example 11 also includes the subject matter according to example 10, above.

The alignment module further includes a template geometry module. The template geometry module includes geometry data for each paint template design and the alignment module is configured to orient the set of alignment marks on a current paint template design based on a geometry for the set of alignment marks on a previous paint template design. The preceding subject matter of this paragraph characterizes example 12 of the present disclosure, wherein example 12 also includes the subject matter according to any one of examples 9-11, above.

The set of alignment marks on the current paint template design includes a first alignment mark that is different than a second alignment mark on the previous paint template design. The preceding subject matter of this paragraph characterizes example 13 of the present disclosure, wherein example 13 also includes the subject matter according to example 12, above.

Additionally disclosed herein is a method for producing paint templates for painting a design on a target surface. The method includes generating, by a processor, a geo-file of paint template designs based on a set of paint sub-designs. The generated geo-file of paint template designs includes a paint template design that corresponds to a paint sub-design for the design. The method further includes producing, by a plotter, a set of paint templates based on the geo-file of paint template designs. Each paint template design includes a set of alignment marks for facilitating painting the design on the target surface and each paint template is produced with a set of alignment apertures corresponding to the set of alignment marks for each respective paint template design. The preceding subject matter of this paragraph characterizes example 14 of the present disclosure.

The step of generating the geo-file of paint template designs includes parsing, by the processor, the design into the set of paint sub-designs, orienting the set of alignment marks on each respective paint template design, and combining a plurality of paint template designs in a predetermined order relative to each other to generate the geo-file of paint template designs. The preceding subject matter of this paragraph characterizes example 15 of the present disclosure, wherein example 15 also includes the subject matter according to example 14, above.

The step of orienting the set of alignment marks on a first paint template design is based on a first geometry for one or more parts in a set of parts associated with the target surface. The preceding subject matter of this paragraph characterizes example 16 of the present disclosure, wherein example 16 also includes the subject matter according to example 15, above.

The step of orienting the set of alignment marks on a second paint template design is based on a second geometry for the set of alignment marks on the first paint template design. The preceding subject matter of this paragraph characterizes example 17 of the present disclosure, wherein example 17 also includes the subject matter according to example 16, above.

The step of orienting the set of alignment marks on a current paint template design is based on a geometry for the set of alignment marks on a previous paint template design. The preceding subject matter of this paragraph characterizes example 18 of the present disclosure, wherein example 18 also includes the subject matter according to any one of examples 15-17, above.

The set of alignment marks on the current paint template design comprises a first alignment mark that is different than a second alignment mark on the previous paint template design. The preceding subject matter of this paragraph characterizes example 19 of the present disclosure, wherein example 19 also includes the subject matter according to example 18, above.

The step of producing the set of paint templates includes forming the set of alignment apertures from each respective paint template based on the corresponding set of alignment marks. The preceding subject matter of this paragraph characterizes example 20 of the present disclosure, wherein example 20 also includes the subject matter according to any one of examples 14-19, above.

The described features, structures, advantages, and/or characteristics of the subject matter of the present disclosure may be combined in any suitable manner in one or more examples, including embodiments and/or implementations. In the following description, numerous specific details are provided to impart a thorough understanding of examples of the subject matter of the present disclosure. One skilled in the relevant art will recognize that the subject matter of the present disclosure may be practiced without one or more of the specific features, details, components, materials, and/or methods of a particular example, embodiment, or implementation. In other instances, additional features and advantages may be recognized in certain examples, embodiments, and/or implementations that may not be present in all examples, embodiments, or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific examples that are illustrated in the appended drawings. Understanding that these drawing depict only typical examples of the subject matter, they are not therefore to be considered to be limiting of its scope. The subject matter will be described and explained with additional specificity and detail through the use of the drawings, in which:

FIG. 3B is a block diagram of another processor included in the computing device of FIG. 2, according to one or more examples of the present disclosure;

FIG. 4 is a block diagram of a template design module included in each one of the processors of FIGS. 3A and 3B, according to one or more examples of the present disclosure;

FIG. 5A is a block diagram of a plotter included in the paint template production system of FIG. 1, according to one or more examples of the present disclosure;

FIG. 5B is a block diagram of another plotter included in the paint template production system of FIG. 1, according to one or more examples of the present disclosure;

DETAILED DESCRIPTION

Reference throughout this specification to "one example," "an example," or similar language means that a particular feature, structure, or characteristic described in connection with the example is included in at least one example of the present disclosure. Appearances of the phrases "in one example," "in an example," and similar language throughout this specification may, but do not necessarily, all refer to the same example. Similarly, the use of the term "implementation" means an implementation having a particular feature, structure, or characteristic described in connection with one or more examples of the present disclosure, however, absent an express correlation to indicate otherwise, an implementation may be associated with one or more examples.

Disclosed herein are a system and method for producing paint templates that facilitate painting a design on a target surface of a component. The system includes a processor configured to generate a geo-file of paint template designs. The processor includes a design module configured to parse the design into a set of paint sub-designs and a template design module configured to generate the geo-file of paint template designs based on the set of paint sub-designs in which the generated geo-file of paint template designs include a paint template design that corresponds to a paint sub-design. The system further includes a plotter configured to produce a set of paint templates based on the geo-file of paint template designs. In some examples, each paint template design includes a set of alignment marks and each paint template is produced with a set of alignment apertures corresponding to the set of alignment marks.

Figure 1:
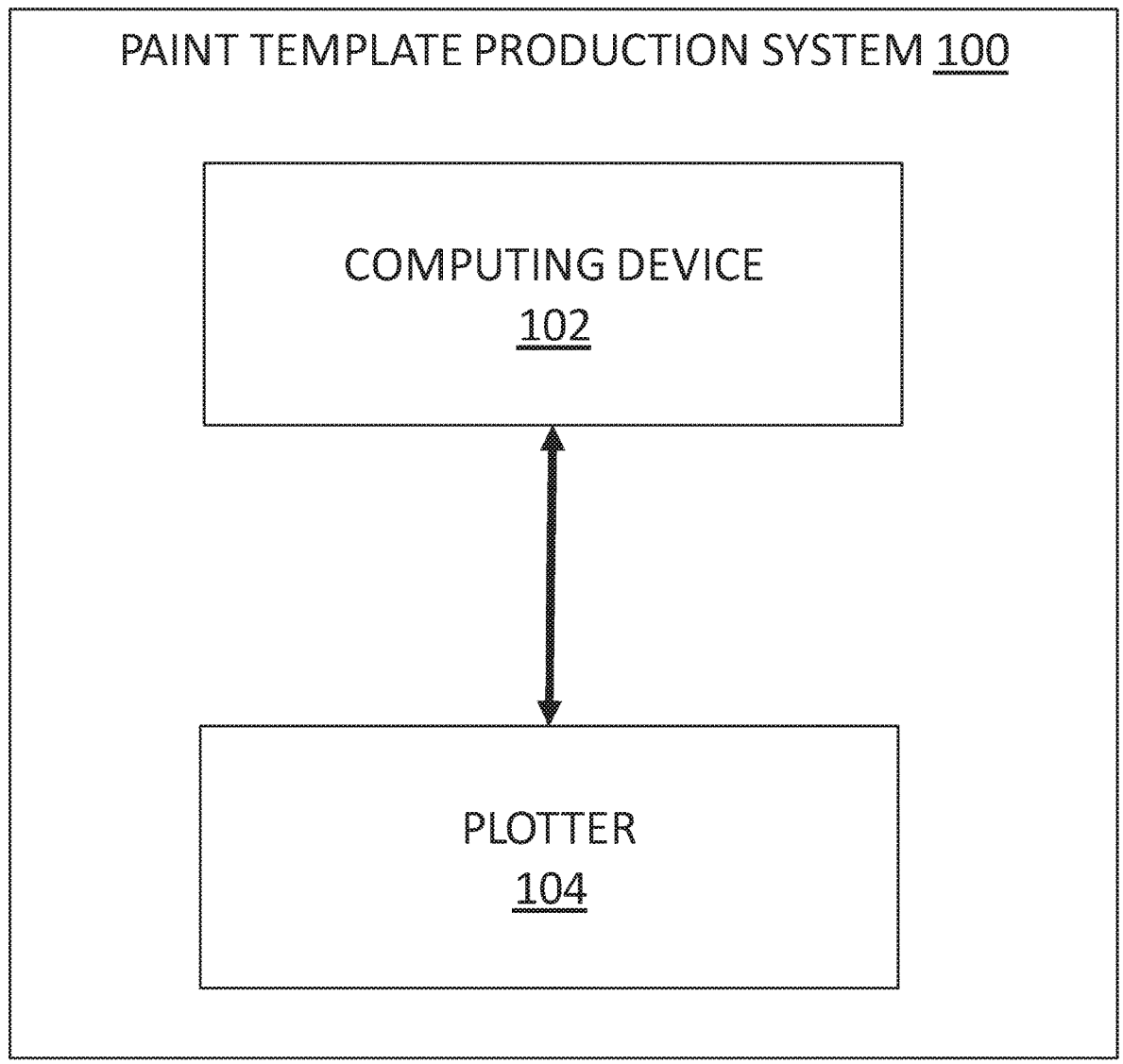
FIG. 1 is a block diagram of a paint template production system, according to one or more examples of the present disclosure.

With reference to the drawings, FIG. 1 is a block diagram of one embodiment of a system 100 for producing paint templates utilized to facilitate painting a paint design and/or logo (also referred to herein individually or collectively as, a paint design, or simply, a design). on the target surface of a component. At least in the illustrated embodiment, system 100 includes, among other components, a computing device 102 coupled to and/or in communication with a plotter 104.

Figure 2:
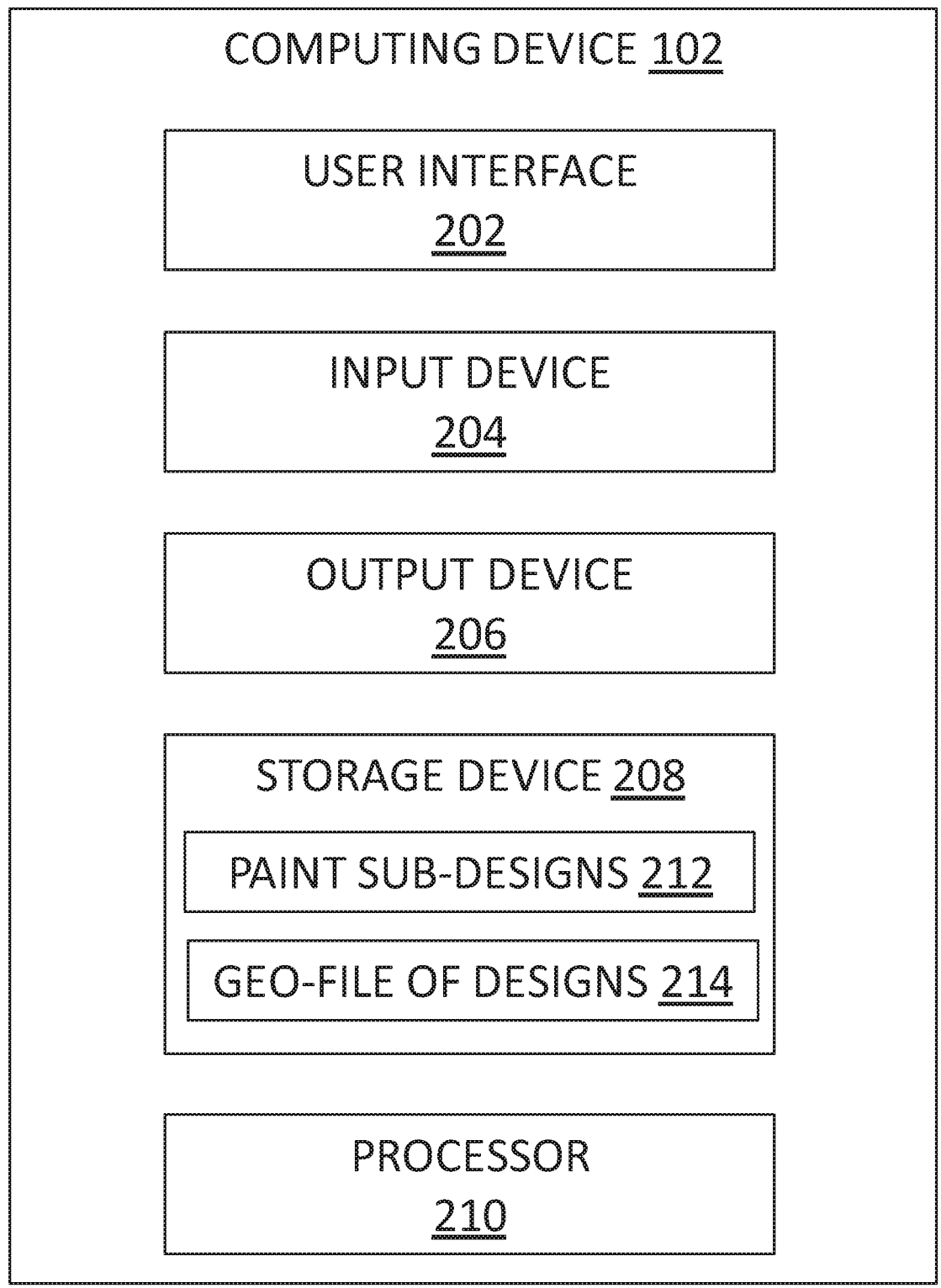
FIG. 2 is a block diagram of a computing device included in the paint template production system of FIG. 1, according to one or more examples of the present disclosure.

A computing device 102 can include any suitable computing system and/or device that can design and/or facilitate designing a paint template. Referring to FIG. 2, a block diagram of one embodiment of the computing device 102 is shown. At least in the illustrated embodiment, the computing device 102 includes, among other components, a user interface (UI) 202, an input device 204, an output device 206, a storage device 208, and a processor 210 coupled to and/or in communication with one another.

In some examples, the UI 202 includes any suitable technology, system, and/or device that is known or developed in the future that enables a user to interact with the computing device 102. According to one example, the UI 202 includes, but is not limited to, a graphical user interface (GUI), among other types of UIs that are possible and contemplated herein.

In some examples, the input device 204 includes any suitable system and/or device that is known or developed in the future that enables a user to interact with the UI 202. Examples of the input device 204 include, but are not limited to, a keyboard, a mouse, touchpad, trackball, pointing stick, joystick, jog dial (or knob), a touch screen, and/or microphone, among other types of input devices that are possible and contemplated herein.

In some examples, the output device 206 includes any suitable system and/or device that is known or developed in the future that can provide data to a user. An example output device 206 includes, but is not limited to, a display or monitor, among other types of output devices that are possible and contemplated herein.

According to certain examples, the storage device 208 includes any suitable type of device and/or system that is known or developed in the future that can store computer-useable data. In various embodiments, the storage device 208 includes one or more non-transitory computer-usable mediums (e.g., readable, writable, readable-writable, etc.), which can include any non-transitory and/or persistent apparatus or device that can contain, store, communicate, propagate, and/or transport instructions, data, computer programs, software, code, routines, etc., for processing by or in connection with a computer processing device (e.g., the processor 210).

In some embodiments, the storage device 208 stores and/or is configured to store a set of paint sub-designs 212 for a paint design generated by the processor 210, as discussed elsewhere herein. In additional or alternative embodiments, the storage device 208 stores and/or is configured to store a geo-file of paint template designs 214 generated by the processor 210, as discussed elsewhere herein.

In some examples, the processor 210 includes any suitable non-volatile/persistent hardware and/or software that can design and/or facilitate designing a paint template. In some embodiments, processor 210 includes hardware and/or software configured to execute instructions and/or rules in one or more modules and/or applications that can design and/or facilitate designing a paint template for a paint design and/or logo.

Figure 3A:
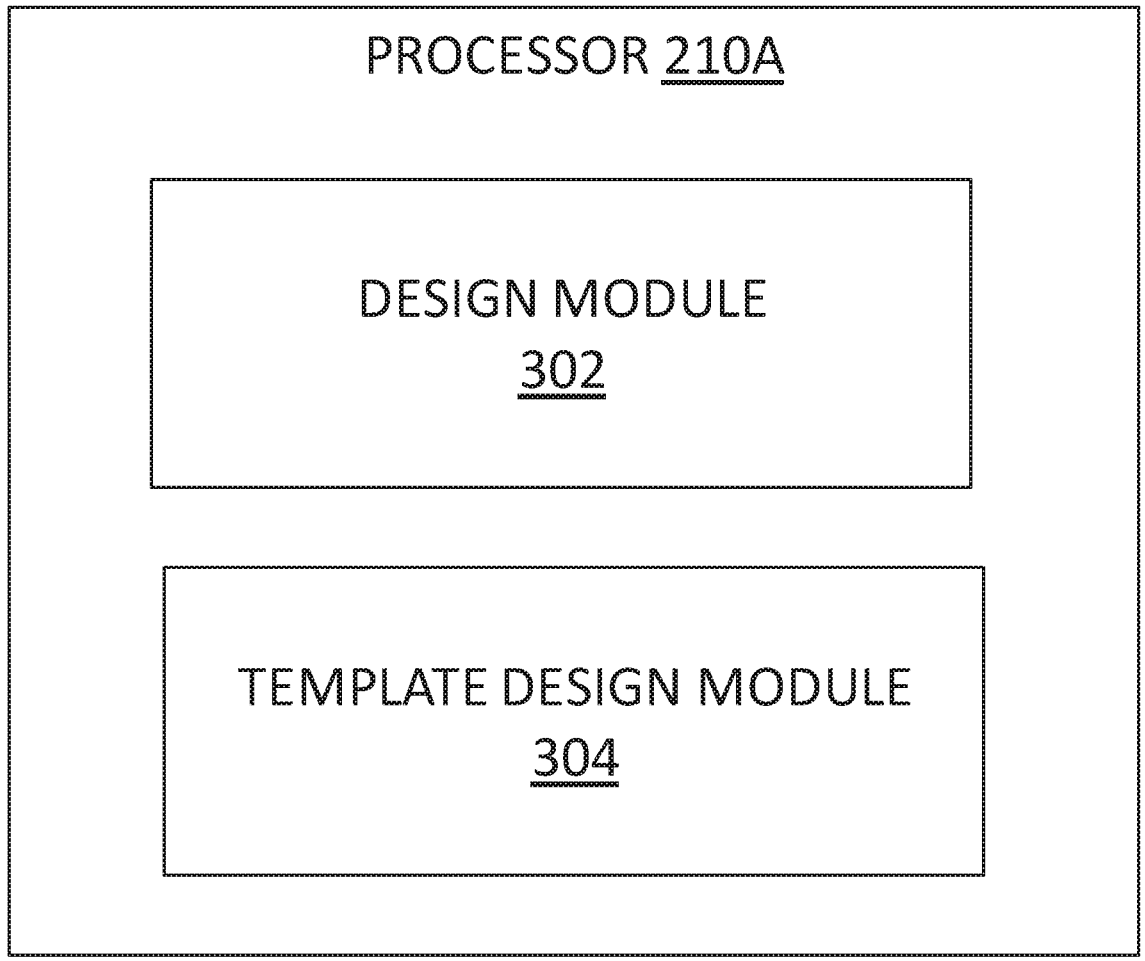
FIG. 3A is a block diagram of a processor included in the computing system of FIG. 2, according to one or more examples of the present disclosure.

With reference to FIG. 3A, a block diagram of one embodiment of a processor 210A that can design and/or facilitate designing a paint template is shown. The processor 210A is one example of the processor 210 of the computing device 102 FIG. 2. At least in the illustrated embodiment, processor 210A includes, among other components, a design module 302 coupled to and/or in communication with a template design module 304.

In some examples, the design module 302 includes any suitable hardware and/or software that can facilitate and/or assist in generating a plurality of paint templates for a paint design. In some embodiments, the design module 302 is configured to receive (e.g., from a user and/or other computing device (not shown)) a paint design.

Further, the design module 302 analyzes the paint design and parses the paint design into multiple different paint layers. For example, the design module 302 is configured to determine that a particular color and/or transition between two or more colors is a combination of two or more different paint layers and parses the particular color and/or transition between colors into the different paint layers to form a set of paint sub-designs 212 for the paint design. The design module 302 is further configured to arrange the different paint layers in the set of paint sub-designs 212 so that the paint layers are painted on a target surface (e.g., the fuselage of an aircraft, etc.) in the correct order.

Referring back to FIG. 2, the set of paint sub-designs 212 may include any suitable quantity of paint sub-designs that allows and/or enables a paint design to be parsed into manageable layers of paint so that the design can be painted on a target surface. In various embodiments, the quantity of paint sub-designs in a set of paint sub-designs 212 can vary based on the type and/or size of a particular paint design. As such, various embodiments of a set of paint sub-designs 212 will typically include two or more paint sub-designs.

In various embodiments, the design module 302 transmits the set of paint sub-designs 212 (including the correct order) to the storage device 208 for storage therein. In additional or alternative embodiments, the design module 302 transmits the set of paint sub-designs 212 (including the correct order) to the template design module 304 for processing therein.

In certain examples, the template design module 304 includes any suitable hardware and/or software that can generate a plurality of paint templates for a paint design. In some embodiments, the template design module 304 is configured to receive a set of paint sub-designs 212 from the design module 302. In additional or alternative embodiments, the template design module 304 is configured to retrieve a set of paint sub-designs 212 from the storage device 208 storing the set of paint sub-designs.

According to one example, the set of paint sub-designs 212 are arranged in the correct order for painting a design on a target surface. In some embodiments, the template design module 304 is configured to arrange the set of paint sub-designs 212 in the correct order for painting the design on a target surface in response to determining that the set of paint sub-designs 212 are not arranged in the correct order.

The template design module 304, in various embodiments, is configured to generate a plurality of paint template designs based on the set of paint sub-designs 212 generated by the design module 302. As such, the quantity of paint template designs can correspond to the quantity of paint sub-designs in the set of paint sub-designs 212.

The plurality of paint template designs can be combined to generate a geo-file of paint template designs 214. In various embodiments, each paint template design in the generated geo-file of paint template designs 214 corresponds to a paint sub-design in the set of paint sub-designs 212. As such, the paint template designs in the geo-file of paint template designs 214 can include the same quantity of paint template designs as the quantity of paint sub-designs in the set of paint sub-designs 212. Further, the paint template designs in the geo-file of paint template designs 214 can be arranged in the same order as their corresponding paint sub-designs in the set of paint sub-designs 212 so that the paint layers forming the paint design on a target surface can be painted in the proper/correct order.

A paint template design (and a corresponding paint template based thereon) may include any suitable shape that allows and/or enables a target surface to be painted. Example shapes can include, but are not limited to, a circle, an oval, a triangle, a quadrilateral, a shape with five or more sides, etc., among other regular or irregular geometric shapes that are possible and contemplated herein. In some embodiments, a paint template design (and its corresponding paint template) may include a rectangular shape, among other shapes that are possible and contemplated herein.

A paint template design (and a corresponding paint template based thereon) may include any suitable dimensions that allow and/or enable a target surface to be painted. In various embodiments, the dimensions correspond to an entirety of the target surface and/or the entirety of the design to be painted on the target surface. In other embodiments, one or more dimensions correspond to one or more portions of the of the target surface and/or one or more portions of the design to be painted on the target surface. In some embodiments in which the paint template design (and its corresponding paint template) includes a rectangular shape, two sides of the rectangle include a length of about one meter (1 m) or about three feet (3 ft.), among other lengths that are possible and contemplated herein, and the remaining two sides include lengths that correspond to a dimension of the design to be painted on the target surface. For example, for a large design (e.g., a design including a height and a length greater than about two meters (2 m) or six feet (6 ft.) to be painted on a particular target surface (e.g., the fuselage of an aircraft), the rectangular paint template design may include a height of about one meter (1 m) or three feet (3 ft.) and a length that matches and/or corresponds to the entire length of the design. Here, it is clear that painting the design (and/or logo) on the fuselage of an aircraft will entail a geo-file of paint template designs 214 to include multiple paint template designs.

Figure 6:
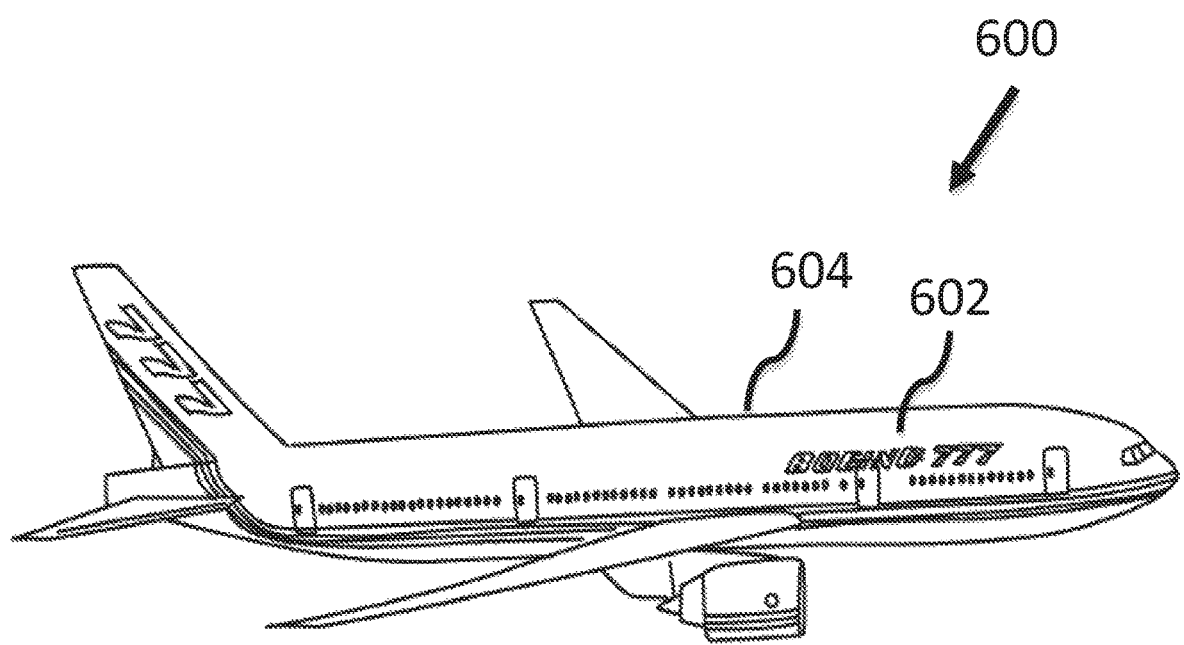
FIG. 6 is a diagram of an aircraft that includes a target surface for painting a design thereon, according to one or more examples of the present disclosure.

In some embodiments, a paint template design (and a corresponding paint template based thereon) includes a set of alignment marks (e.g., one or more alignment marks that are schematically similar to actual alignment marks or alignment apertures 702A and 702B (see, e.g., FIG. 7)) to facilitate aligning a paint template corresponding to the paint template design on a target surface (see, e.g., an aircraft fuselage 604 (FIG. 6)) and/or on one or more previous paint layers. That is, the set of alignment marks are utilized to properly and/or correctly orient the paint template on the target surface and/or on the previous paint layer(s).

With reference to FIG. 4, a block diagram of one embodiment of a template design module 304 is shown. At least in the illustrated embodiment, the template design module 304 includes, among other components, an alignment mark module 402 coupled to and/or in communication with an alignment module 404.

In some examples, the alignment mark module 402 includes any suitable hardware and/or software that can include and/or facilitate including a set of alignment marks on a paint template design. According to certain examples, an alignment mark includes any suitable mark, indication, and/or identifier that is known or developed in the future that can be utilized to align and/or orient a paint template on a target surface to be painted and/or on one or more previous layers of paint. In some embodiments, an alignment mark represents an aperture (e.g., an alignment aperture). In additional or alternative embodiments, an alignment mark can include a transparent and/or semi-transparent area in a particular material that includes and/or forms at least a portion of a paint template.

In some embodiments, all of the alignment marks in a paint template design 214 (and its corresponding paint template 514 (see, e.g., FIG. 5A)) are alignment apertures. In other embodiments, at least two alignment marks in a paint template design 214 (and its corresponding paint template 514) are different alignment marks. For example, at least one alignment mark includes an alignment aperture and at least one other alignment mark includes a transparent and/or semi-transparent area, among other combinations that are possible and contemplated herein.

In some examples, the alignment mark includes any suitable shape that is known or developed in the future. Example shapes include, but are not limited to, a regular or irregular geometric shape (e.g., a circle, an oval, a triangle, a quadrilateral, a shape with five or more sides, etc.), a biometric shape (e.g., an eye, a teardrop, an eyebrow, a hand, a finger, a foot, a toe, an ear, a nose, a mouth, a head, a torso, an arm, a leg, a tail, a fingernail, a toenail, etc.), and/or a natural shape (e.g., a tree, a leaf, a fruit, a plant, a rock, a mountain, a hill, a point, a peninsula, a diamond, a prism, a cylinder, a pyramid, a star, a waterfall, a snowflake, a raindrop, a body of water (e.g., a river, a stream, a lake, a pond, an ocean, a sea, a bay, etc.)), etc., among other regular and/or irregular shapes that are possible and contemplated herein.

Figure 7A:
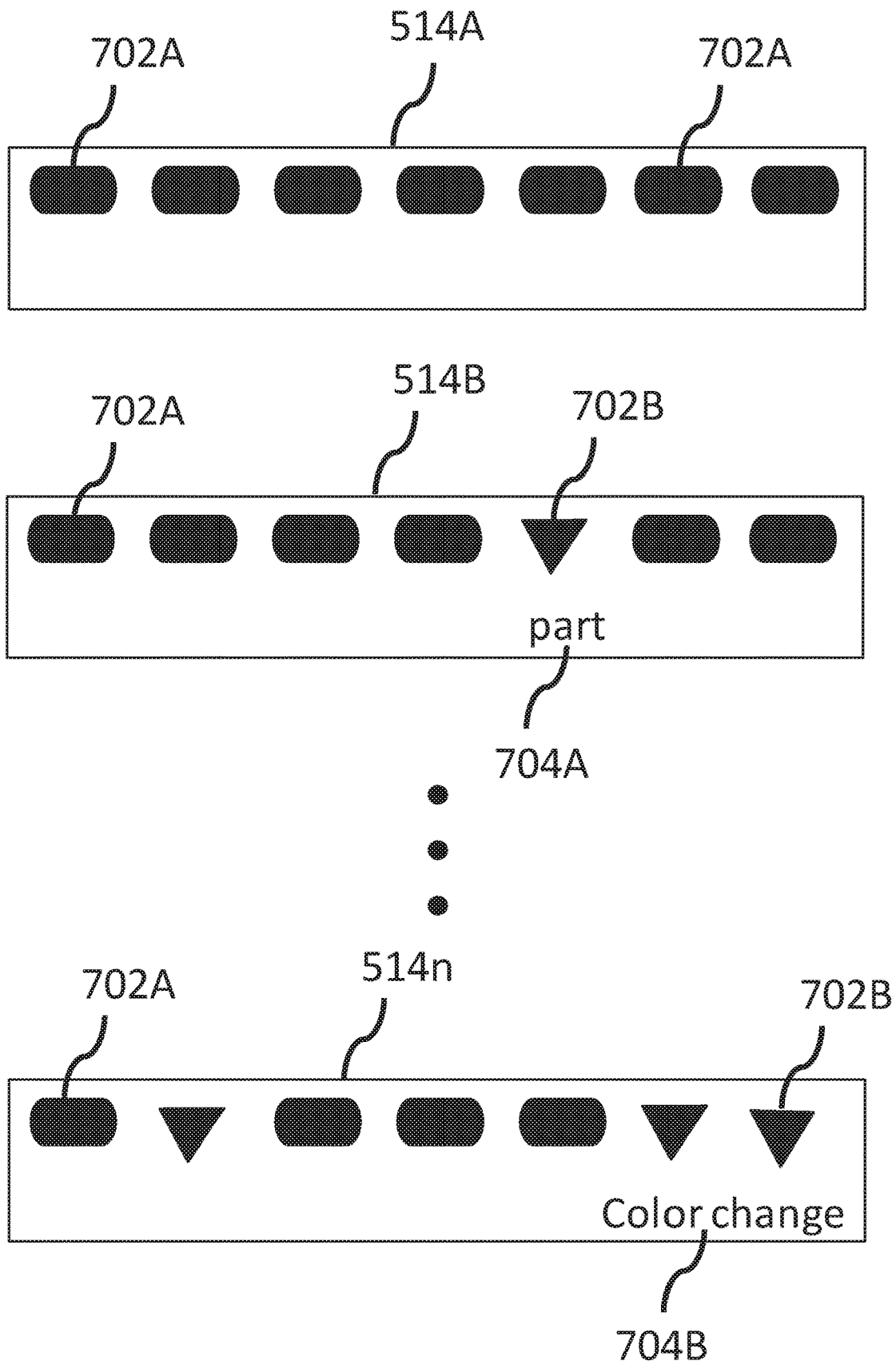
FIG. 7A is a top plan view of a first set of paint templates each including a set of alignment apertures, according to one or more examples of the present disclosure.

In some embodiments, all of the alignment marks in a paint template design (and its corresponding paint template) include the same shape. In other embodiments, at least two alignment marks in a paint template design 214 (and its corresponding paint template 514) include different shapes. With reference to FIG. 7, for example, an alignment mark 702A includes a different shape than an alignment mark 702B. The different shapes can have different meanings, instructions, and/or denotations, as discussed elsewhere herein.

Further, an alignment mark includes any suitable size and/or area that can include and/or form an alignment mark. In various examples, an alignment mark is an alignment aperture.

In some embodiments, all of the alignment marks in a paint template design (and its corresponding paint template) have the same size. In other embodiments, at least two alignment marks in a paint template design (and its corresponding paint template) include different sizes.

In additional examples, a paint template design (and a paint template based thereon) includes any suitable quantity of alignment marks that allows and/or enables proper alignment of a paint template to a target surface and/or one or more previous layers of paint.

In certain examples, a paint template design (and a paint template based thereon) includes any suitable quantity per unit length of alignment marks that allows and/or enables proper alignment of a paint template to a target surface and/or one or more previous layers of paint. In various embodiments, a paint template design (and paint template) includes a quantity per unit length of alignment marks in the range of about one (1) alignment marks per centimeter (1 cm) to about 1 alignment mark per ten centimeters (10 cm), among other quantities per unit length and/or ranges of quantities per unit length that are possible and contemplated herein. In some embodiments, a paint template design (and paint template) includes a quantity per unit length of alignment marks in the range of about one (1) alignment marks per five centimeters (5 cm) or one alignment mark every two (2) inches, among other quantities per unit length that are possible and contemplated herein.

In some embodiments, different portions of a paint template design (and paint template based thereon) include two or more portions that include different alignment marks and/or different alignment marks per unit lengths. That is, different alignment marks are utilized to denote different instructions and/or orientations of the paint design on the surface in some examples. For example, a first alignment mark can denote continuity of a color or feature of the paint design, whereas a second alignment mark can denote a color transition, an intersection of colors, a transition of features of the design, and/or an intersection of features of the design, among other purposes that are possible and contemplated herein. In another non-limiting example, a portion of a paint template design (and paint template) may include more alignment marks per unit length at a position in which the design intersects multiple colors, transitions from one color to another color, intersects a color and a position (or part) on the paint target surface, intersects multiple parts and a color, intersects a position (or part) and multiple colors, intersects multiple parts and multiple colors, and/or where the design intersects/transitions from one shape/feature to another shape/feature than a portion of the paint template design (and paint template) that does not include an intersection/transition of color, positions, parts, shapes, and/or features, among other purposes that are possible and contemplated herein.

In additional or alternative embodiments, a paint template design includes a set of symbols (e.g., one or more of symbol 704A and symbol 704B) included thereon. A symbol includes any suitable symbol that is known or developed in the future that can be understood and/or interpreted by a human and/or computing device. Example symbols include, but are not limited to, alphanumeric symbols, words, shapes, lines, and/or icons, etc., among other symbols that are possible and contemplated herein. In some embodiments, one or more of the symbols can include/form instructions or notes and/or may be representative of instructions or notes for using and/or aligning a paint templated generated from the paint template design.

In some embodiments, all of the symbols in a set of paint template designs 214 (and their corresponding paint template(s) 514) include the same symbol 704. In other embodiments, at least two different paint template designs 214 (and their corresponding paint templates 514) include different symbols 704.

As discussed elsewhere herein, a geo-file of paint template designs 214 includes multiple paint template designs. In various embodiments, at least two paint template designs in a geo-file of paint template designs 214 include different quantities of alignment marks (e.g., alignment apertures, etc.). In additional or alternative embodiments, at least two paint template designs in a geo-file of paint template designs 214 include one or more different alignment marks (e.g., an alignment aperture and a transparent and/or semi-transparent area, etc.) included respectively thereon. In further additional or alternative embodiments, at least two paint template designs in a geo-file of paint template designs 214 include one or more differently shaped alignment marks included respectively thereon. In still further additional or alternative embodiments, at least two paint template designs in a geo-file of paint template designs 214 include one or more differently sized and/or dimensioned alignment marks included respectively thereon. In yet further additional or alternative embodiments, at least two paint template designs in a geo-file of paint template designs 214 include one or more portions with different alignment marks per unit length included respectively thereon. In other additional or alternative embodiments, at least two paint template designs in a geo-file of paint template designs 214 include one or more different symbols included respectively thereon.

In certain examples, the alignment module 404 of the template design module 304 includes any suitable hardware and/or software that can include and/or facilitate including a set of alignment marks on a paint template design. At least in the illustrated embodiment, the alignment module 404 includes, among other components, a part geometry module 406 and a template geometry module 408.

The part geometry module 406, in some examples, includes any suitable hardware and/or software that can include data about a target surface. In certain examples, the target surface is the surface of a component (e.g., an aircraft (see, e.g., FIG. 6), a spacecraft, an automobile, a truck, a train, a billboard, a building, etc.) that includes one or more parts of the component included and/or formed thereon. Here, the part geometry module 406 includes data (e.g., a schematic diagram, etc.) about one or more parts and/or portions of the components. That is, the data can include a listing of parts of a component, characteristics of one or more portions of the target surface (e.g., size, plane(s), curvature, tapering, intersection(s) of parts of the component, intersection(s) of the part(s) of the component located adjacent to the target surface, etc.), and a listing of component parts located adjacent to the target surface and their orientation and/or locations relative to one another. Further, the part geometry module 406 is configured to determine the relative position and/or orientation of the parts of the component, characteristics of one or more portions of the target surface, and the component parts located adjacent to the target surface to a position on the target surface where the paint design is to be painted thereon.

In a non-limiting example in which the surface of the component is an aircraft fuselage 604 (see, e.g., FIG. 6), the part geometry module 406 can include a listing and schematic of the parts of the fuselage 604 (e.g., nose, tail, landing gear, lights, window(s), door(s), hatch(es), etc.), characteristics of one or more portions of the fuselage (e.g., size, length, curvature, tapering, intersection of parts and/or portions of the fuselage, intersection(s) of the part(s) of the aircraft located adjacent to the fuselage and the fuselage, etc.), and/or the parts located adjacent to the fuselage 604 (e.g., wings, horizontal stabilizers, vertical stabilizer, etc.). Further, part geometry module 406 is configured to determine the relative location(s) and/or orientation of the various fuselage parts, portion characteristic(s) of the fuselage 604, and/or the parts of the aircraft 600 located adjacent to the fuselage 604 to a position where the paint design 602(e.g., a company logo and/or name (see, e.g., FIG. 6)) is to be painted on the fuselage 604.

In various embodiments, the template geometry module 408 includes any suitable hardware and/or software that can include data about one or more paint templates and/or one or more layers of paint already applied to a target surface. For example, the target surface can already include one or more layers of the design painted thereon. Here, the template geometry module 408 includes data (e.g., a schematic diagram, etc.) about one or more portions of the design already painted on the target surface. That is, the data includes a listing of the portions of the design, characteristics of one or more portions of the design, and a listing of the component parts located adjacent to the target surface and their orientation and/or locations relative to one another. In certain examples, the template geometry module 408 is configured to determine the relative position and/or orientation of the completed portions of the design, characteristics of one or more portions of the design, and the component parts located adjacent to the completed portion(s) of the design to a position on the target surface where one or more subsequent portions of design is/are to be painted thereon.

In continuing the non-limiting aircraft example above and according to certain examples, the template geometry module 408 includes the listing and schematic of the completed portion(s) of the design on the fuselage 604, one or more characteristics of the one or more completed portions of the design 602, and/or the listing and schematic of the parts of the aircraft 600 located adjacent to the fuselage 604. Further, the template geometry module 408 is configured to determine the relative location(s) and/or orientation of the completed portion(s), characteristic(s) of the completed portion(s), and/or the parts of the aircraft 600 located adjacent to the completed portion(s) of the paint design 602 to the position where one or more subsequent portions and/or paint layers of the paint design 602 is/are to be painted on the fuselage 604.

In various embodiments, the alignment module 404 is configured to utilize the part geometry module 406 and/or the template geometry module 408 to determine the location on the paint template design where to orient each alignment mark of a set of alignment marks. In a non-limiting example for a first paint layer of a design, the alignment module 404 utilizes the data in the part geometry module 406 to determine where to orient the alignment mark(s) of the paint template design relative to one or more parts of the component that includes the target surface, one or more portions of the target surface, one or more characteristics of the target surface, and/or one or more parts of the component that is/are adjacent to the target surface. In some examples, the alignment mark(s) can be utilized, when included on a paint template based on the paint template design, to properly and/or correctly align the paint template on the target surface with respect to the part(s) of the component on the target surface, the portion(s) of the target surface, the characteristic(s) of the target surface, and/or the part(s) of the component that is/are adjacent to the target surface so that the first layer of the design can be painted on the target surface at the intended and/or correct position.

In an additional or alternative non-limiting example for a second paint layer of a design and/or a subsequent paint layer of the design, the alignment module 404 utilizes the data in the template geometry module 408 to determine where to orient the alignment mark(s) of the paint template design relative to one or more portions of the design already painted on the target surface. Here, the alignment mark(s) are utilized, when included on a paint template based on the paint template design, to properly and/or correctly align the paint template on the target surface with respect to the portion(s) of the design already painted on the target surface (e.g., one or more previous paint layers) so that the second layer or the subsequent layer of the design can be painted on the target surface relative to the first layer or the previous layer at the intended and/or correct position.

In a further additional or alternative non-limiting example for the second paint layer of a design and/or the subsequent paint layer of the design, the alignment module 404 utilizes the data in the part geometry module 406 and the data in the template geometry module 408 to determine where to orient the alignment mark(s) of the paint template design relative to one or more parts of the component that includes the target surface, one or more portions of the target surface, one or more characteristics of the target surface, and/or one or more parts of the component that is/are adjacent to the target surface and relative to one or more portions of the design already painted on the target surface. Here, the alignment mark(s) are utilized, when included on a paint template based on the paint template design, to properly and/or correctly align the paint template on the target surface with respect to the part(s) of the component on the target surface, the portion(s) of the target surface, the characteristic(s) of the target surface, and/or the part(s) of the component that is/are adjacent to the target surface and with respect to the portion(s) of the design already painted on the target surface so that the second layer or the subsequent layer of the design can be painted on the target surface at the intended and/or correct position.

Referring to FIG. 3B, a block diagram of another embodiment of a processor 210B that designs and/or facilitates designing a paint template is shown. The processor 210B is one example of the processor 210 of the computing device 102 FIG. 2. The processor 210B includes a design module 302 coupled to and/or in communication with the template design module 304 similar to the processor 210A discussed elsewhere herein. At least in the illustrated embodiment, the processor 210B further includes, among other components, a communication module 306 coupled to and/or in communication with the template design module 304 and the storage device 208.

The communication module 306 includes any suitable communication hardware and/or software that allows and/or enables communication between the processor 210B (see, e.g., the template design module 304 (FIG. 3)) and the storage device 208 and/or between the processor 210B (see, e.g., the template design module 304 (FIG. 3)) and the plotter 104.

In various embodiments, the communication module 306 transmits and/or facilitates transmitting the geo-file of the paint template designs 214 (including the correct order) from the template design module 304 to the storage device 208 for storage therein. In additional or alternative embodiments, the template design module 304 transmits the geo-file of paint template designs 214 (including the correct order) from the template design module 304 to the plotter 104 for processing therein.

With reference back to FIG. 1, the plotter 104 includes any suitable system and/or device that can produce and/or facilitate producing a set of paint templates 514 (see, e.g., FIGS. 5A and 5B). In various embodiments, the set of paint templates 514 are based on the set of paint template designs included in the geo-file of paint template designs 214 generated by the computing device 102.

In various examples, the paint template(s) in the set of paint templates 514 are utilized to paint the design on the target surface. The target surface, in certain examples, is any suitable surface and/or component that is known or developed in the future. Example target surfaces can include, but are not limited to, the surface of a spacecraft, an automobile, a truck, a train, a billboard, or a building, etc., among other surfaces that are possible and contemplated herein. In some embodiments, the target surface is the fuselage of an aircraft, as discussed elsewhere herein.

The paint template includes and/or is formed of any suitable material that can allow and/or enable the design to be painted on the target surface and/or on the component. In various embodiments, the paint template includes and/or is formed from a polyester or plastic film, among other similar materials that are possible and contemplated herein. In some embodiments, the polyester film includes a Biaxially-oriented Polyethylene Terephthalate (BoPET) or other stretched Polyethylene Terephthalate (PET), which includes Mylar®, among other materials that are possible and contemplated herein.

With reference to FIG. 5A, a block diagram of one embodiment of a plotter 104A is shown. At least in the illustrated embodiment, the plotter 104A includes, among other components, an input/output (I/O) module 502, a storage device 504, a processor 506A including a template module 508A, and a cutting component 510 coupled to and/or in communication with one another.

The I/O module 502 includes any suitable hardware and/or software that can communicate and/or facilitate the plotter 104 communicating with the computing device 102. In various embodiments, the I/O module 502 is configured to receive the geo-file of paint template designs 214 from the computing device 102. In additional or alternative embodiments, the I/O module 502 is configured to retrieve the geo-file of paint template designs 214 from the storage device 208 in the computing device 102.

In certain examples, each paint template design in the geo-file of paint template designs 214 is arranged in the correct order for painting the design on the target surface. In some embodiments, the plotter 104 is configured to arrange the paint template designs in the geo-file of paint template designs 214 in the correct order for painting the design on the target surface in response to determining that the paint template designs in the geo-file of paint template designs 214 are not arranged in the correct order.

The storage device 504, in various embodiments, includes any suitable type of device and/or system that is known or developed in the future that can store computer-useable data. In various embodiments, the storage device 504 includes one or more non-transitory computer-usable media (e.g., readable, writable, readable-writable, etc.), which includes any non-transitory and/or persistent apparatus or device that can contain, store, communicate, propagate, and/or transport instructions, data, computer programs, software, code, routines, etc., for processing by or in connection with a computer processing device (see, e.g., the processors 506A and 506B).

In some embodiments, the storage device 504 stores and/or is configured to store the set of paint templates 514 for the paint design generated by the processors 506A and 506B, as discussed elsewhere herein. In additional or alternative embodiments, the storage device 504 stores and/or is configured to store the received/retrieved geo-file of paint template designs 214 generated by the processor 210, as discussed elsewhere herein.

The processor 506A, in various embodiments, includes any suitable non-volatile/persistent hardware and/or software that can produce and/or facilitate producing the paint template(s). In various embodiments, the processor 506A includes hardware and/or software configured to execute instructions and/or rules in one or more modules and/or applications that can produce and/or facilitate producing the set of paint templates 514 for the paint design and/or logo based the geo-file of paint template designs 214.

In various embodiments, the processor 506A includes a template module 508A that includes any suitable hardware and/or software that can generate the paint template for the paint design. The template module 508A, in various embodiments, is configured to generate a plurality of paint templates based on the geo-file of paint template designs 214 generated by the template design module 304. In certain examples, the quantity of paint templates corresponds to the quantity of paint template designs in the geo-file of paint template designs 214.

The plurality of paint templates, in various embodiments, are be combined to generate the set of paint templates 514. In some embodiments, each paint template in the generated set of paint templates 514 corresponds to the paint template design in the geo-file of paint template designs 214. Here, the paint templates in the set of paint templates 514 include the same quantity of paint templates as the quantity of paint template designs in the geo-file of paint template designs 214. Further, the paint templates in the set of paint templates 514 can be arranged in the same order as their corresponding paint template designs in the geo-file of paint template designs 214 so that the paint layers of the paint design on the target surface are painted in the proper/correct order.

In various examples, the paint template(s) include any suitable shape that allows and/or enables the target surface to be painted. Example shapes can include, but are not limited to, a circle, an oval, a triangle, a quadrilateral, a shape with five or more sides, etc., among other regular or irregular geometric shapes that are possible and contemplated herein. In some embodiments, the paint template includes a rectangular shape, among other shapes that are possible and contemplated herein.

The paint template, in various examples, includes any suitable dimensions that allow and/or enable the target surface to be painted. In various embodiments, the dimensions correspond to an entirety of the target surface and/or the entirety of the design to be painted on the target surface. In other embodiments, one or more dimensions correspond to one or more portions of the of the target surface and/or one or more portions of the design to be painted on the target surface. In some examples in which the paint template includes a rectangular shape, two sides of the rectangle include a length of about one meter (1 m) or about three feet (3 ft.), among other lengths that are possible and contemplated herein, and the remaining two sides include lengths that correspond to the dimension of the design to be painted on the target surface. For example, for a large design (e.g., a design including a height and a length greater than about two meters (2 m) or six feet (6 ft.) to be painted on the particular target surface (e.g., the fuselage of an aircraft)), the rectangular paint template design includes a height of one meter (1 m) or three feet (3 ft.) and a length that matches and/or corresponds to the entire length of the design. Here, it is clear that painting the design (and/or logo) on the fuselage of the aircraft entails a set of paint templates 514 that includes multiple paint templates.

In some embodiments, the paint template includes a set of alignment marks (e.g., one or more alignment marks) that align the paint template on the target surface and/or align the paint template to one or more previous paint layers. That is, the set of alignment marks are utilized to properly and/or correctly orient the paint template on the target surface and/or on the previous paint layer(s).

In various embodiments, the paint template includes any of the various embodiments of an alignment mark or set of alignment marks discussed elsewhere herein. In certain examples, the alignment mark and/or set of alignment marks on the paint template includes any one or more of the alignment mark characteristics (e.g., shape(s), size(s), dimension(s), area(s), quantity/quantities, quantity/quantities per unit length(s), type(s), etc., among other characteristics that are possible and contemplated herein) discussed elsewhere herein with respect to the alignment mark and/or the paint template design. In some embodiments, a set of paint templates includes one or more alignment apertures utilized to align/orient the paint template(s) on a target surface and/or a previous layer of paint.

In some examples, the set of paint templates 514 includes multiple paint templates. In various embodiments, at least two paint templates in the set of paint templates 514 include different quantities of alignment marks (e.g., alignment apertures, etc.). In additional or alternative embodiments, the paint template includes two or more different alignment marks (e.g., alignment apertures with different shapes and/or sizes, etc.) included thereon. In further additional or alternative embodiments, at least two paint templates in the set of paint templates 514 include two or more different alignment marks (e.g., alignment apertures with different shapes and/or sizes, etc.) included respectively thereon. In still further additional or alternative embodiments, at least two paint templates in the set of paint templates 514 include two or more differently sized and/or dimensioned alignment marks included respectively thereon. In yet further additional or alternative embodiments, at least two paint templates in the set of paint templates 514 include two or more portions with different alignment marks per unit length included respectively thereon.

In various embodiments, the cutting component 510 includes any suitable system, device, and/or apparatus that can produce and/or facilitate producing one or more paint templates. In some embodiments, the cutting component 510 includes a sharp edge, knife blade, and/or other cutting apparatus that is capable of removing one or more portions from a material (e.g., a BoPET material (Mylar®)) to produce the paint template. In some embodiments, the cutting component 510 is configured to remove material from various areas/portions of the material to form the set of alignment marks on the paint template. The set of alignment marks formed on the paint template(s) (e.g., the removed material), in certain examples, correspond to the alignment mark(s) in a paint template design and include the one or more characteristics of the various alignment marks.

With reference to FIG. 5B, a block diagram of one embodiment of the plotter 104B is shown. At least in the illustrated embodiment, the plotter 104B includes the I/O module 502, the storage device 504, and the cutting component 510 similar to the plotter 104A discussed above. In various embodiments, the plotter 104B further includes, among other components, a processor 506B including a template module 508B and a scribe component 512 coupled to and/or in communication with one another.

The processor 506B, in various embodiments, is configured similar to and/or includes all of the functionality of processor 506A discussed elsewhere herein. Further, the template module 508B is configured similar to and/or includes all of the functionality of the template module 508A discussed elsewhere herein.

In various embodiments, the template module 508B (and the processor 506B) is configured to generate a paint template that includes the set of symbols (e.g., any of the one or more symbols discussed above). The symbol, in certain examples, includes any suitable symbol that is known or developed in the future that can be understood and/or interpreted by a human and/or computing device. Example symbols include, but are not limited to, alphanumeric symbols, words, shapes, lines, and/or icons, etc., among other symbols that are possible and contemplated herein. In some embodiments, the one or more of symbols include/form instructions or notes and/or are representative of instructions or notes for using and/or aligning the paint templated generated from the paint template design.

In some embodiments, all of the symbols in the paint template include the same symbol. In other embodiments, at least two symbols in the paint template include different symbols. In additional or alternative embodiments, at least two paint templates in the set paint templates 514 include two or more different symbols.

The scribe component 512 includes any suitable system, device, and/or apparatus that can produce one or more symbols on the paint template. In various embodiments, the scribe component 512 includes a pen, pencil, marker, scratch awl, and/or other marking apparatus that is capable of producing one or more symbols on a material (e.g., a BoPET material (Mylar®)). In certain examples, the set of symbols formed on the paint template(s) correspond to the symbol(s) in the paint template design and include the one or more characteristics of the various symbol(s) discussed herein.

As described in the various examples discussed above, the design module 302, in various embodiments, is configured to parse an overall design that includes numerous paint sub-designs 212. The paint sub-design 212 is used by a plotter (see, e.g., the plotter 104A (FIG. 5A) and the plotter 104B (FIG. 5B)) for making a paint template or mylar part that is positioned against a component (e.g., a vehicle (an aircraft)) for painting a stripe, pattern or logo on a portion of the vehicle. For a long fuselage of an aircraft, as an example, a geo-file of paint template designs 214 includes multiple paint sub-designs 212 for making multiple the paint templates 514 for different sections of the fuselage.

Figure 7B:
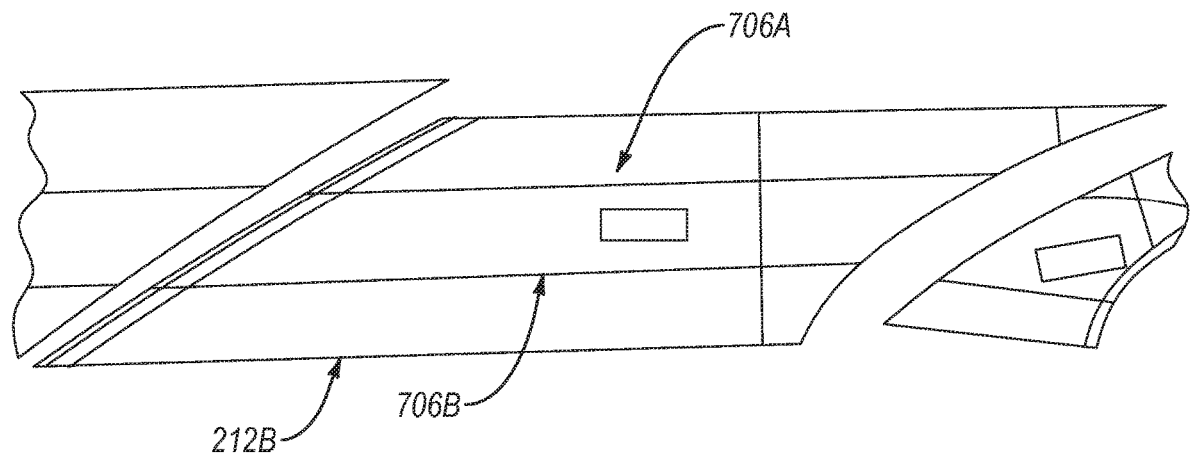
FIG. 7B is a top plan view of a second set of paint templates each including a set of alignment apertures, according to one or more examples of the present disclosure.
Figure 7C:
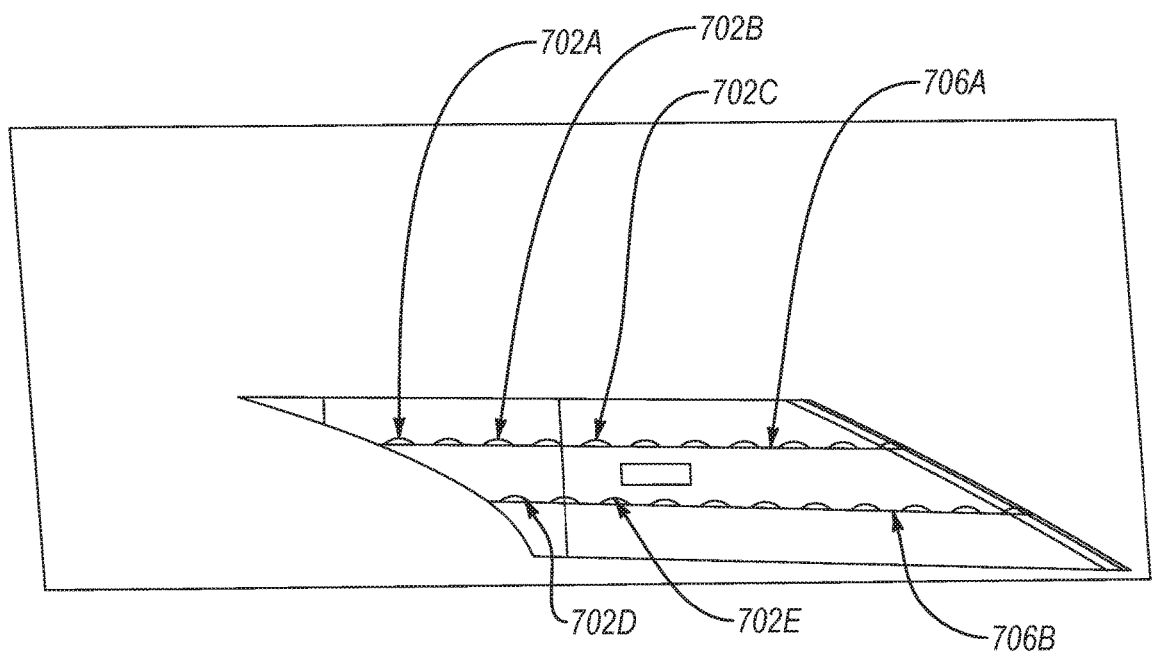
FIG. 7C is a top plan view of a third set of paint templates each including a set of alignment apertures, according to one or more examples of the present disclosure.

In certain examples, the design module 302 is configured to parse the design into the set of paint sub-designs 212 in which one of the paint sub-designs corresponds to a select paint sub-design 212B (for use in making a paint template 514), as shown in FIG. 7B. The template design module 304, is some examples, is configured to generate a geo-file of paint template designs 214 using the set of paint sub-designs 212, where the template design module 304 selectively removes geometry and/or artifacts not associated with the select paint sub-design 212B (that corresponds to a select paint template or mylar part), such that the template design module 304 generates a geo file of only a select paint sub-design 212B.

The alignment module 404, in various examples, is configured to create alignment marks (e.g., to be scribed) and alignment apertures 702 (e.g., to be cut) in which the alignment apertures 702 have a geometric shape or artifact that is oriented relative to the select paint sub-design 212B. The alignment module 404, in some examples, is configured utilize the part geometry and/or template geometry information to determine the location where to orient an alignment aperture 702A, such as along one side of a paint line 706A (where the paint line is used in positioning a fabricated paint template 514 or mylar part relative to a vehicle with the paint line in alignment with a paint layer on the vehicle). The alignment module 404, in further examples, is configured to determine another location where to orient further alignment apertures 702D and 702E, such as along a paint line 706B, where the alignment aperture 702D is on an opposite side of the paint line 706B. In still further examples, the alignment module 404 is configured to determine the location where to orient the alignment aperture 702A of the set of alignment apertures 702B, 702C, 702D, and 702E, etc., where the alignment apertures are included in a geometry sub-set associated with portions of a produced paint template 514 that a plotter 104A or 104B will cut out with a cutting component 510 to produce the paint template 514, and where other geometry features such as text, lines or alignment marks that are only to be scribed/marked are included in another separate geometry sub-set associated with portions of a produced paint template 514 that a plotter 104B will scribe with a scribe component 512.

In some embodiments, the template design module 304 is configured to generate a geo-file of designs 214 for a paint template design that includes the alignment apertures 702 in a sub-set associated with portions of the paint template that a plotter 104 will cut, and the scribe-only lines and alignment marks in a second sub-set associated with portions of the paint template that a plotter 104 will scribe. Here, the template design module 304 is in communication with the communication module 306 that is coupled to the plotter 104. Further, the template design module 304 is configured to transmit the generated geo-file of the paint template design 214 to the plotter 104 so as to thereby produce the paint template and/or mylar part with alignment apertures 702 that are cut out and separately scribed lines, symbols, and/or alignment marks.

Figure 8:
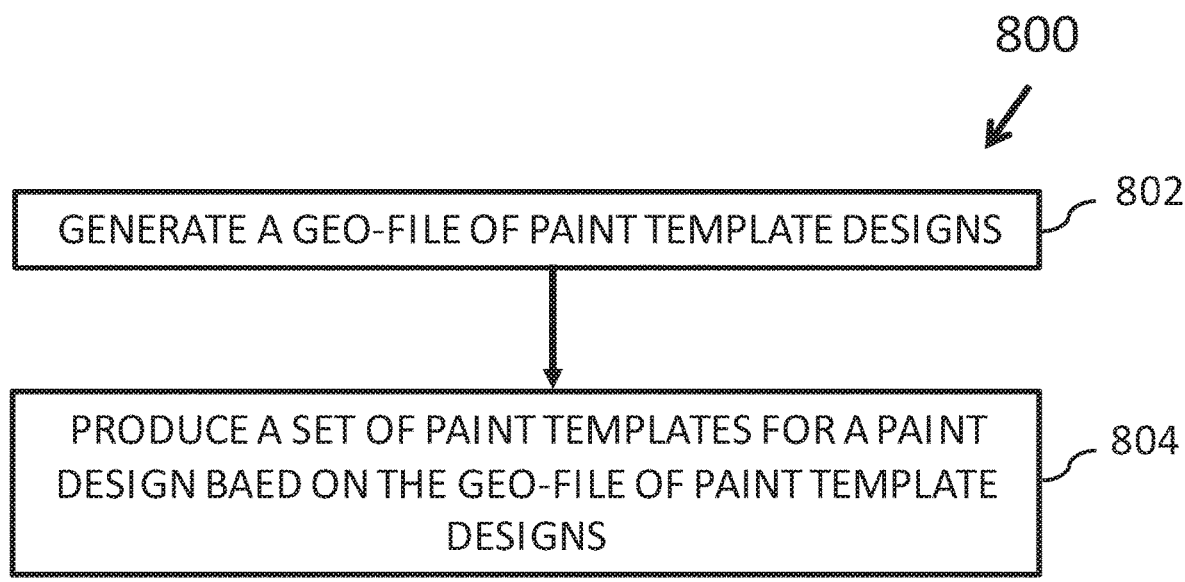
FIG. 8 is a schematic flow diagram of a method for producing and/or facilitating production of a set of paint templates, according to one or more examples of the present disclosure.
Figure 9:
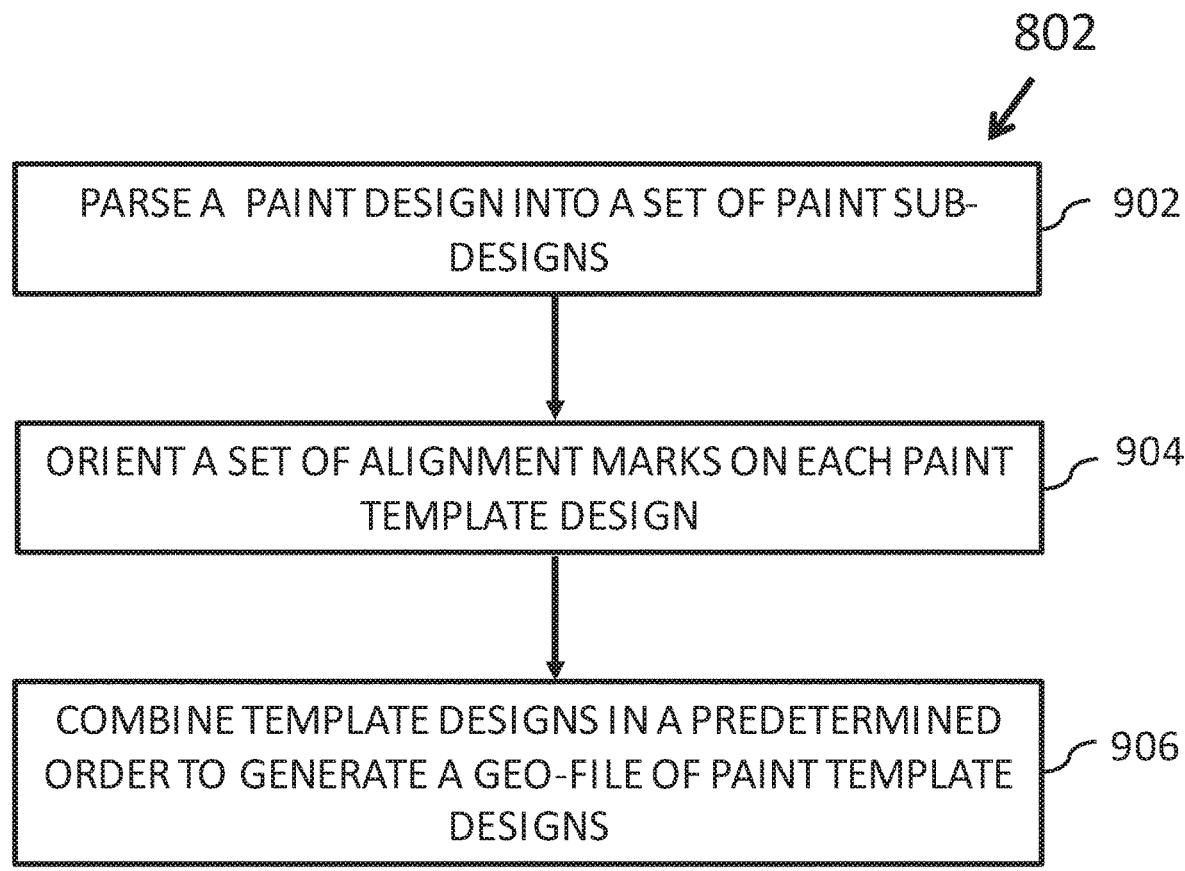
FIG. 9 is a schematic flow diagram of sub-steps of the method of FIG. 8, according to one or more examples of the present disclosure.
Figure 10:
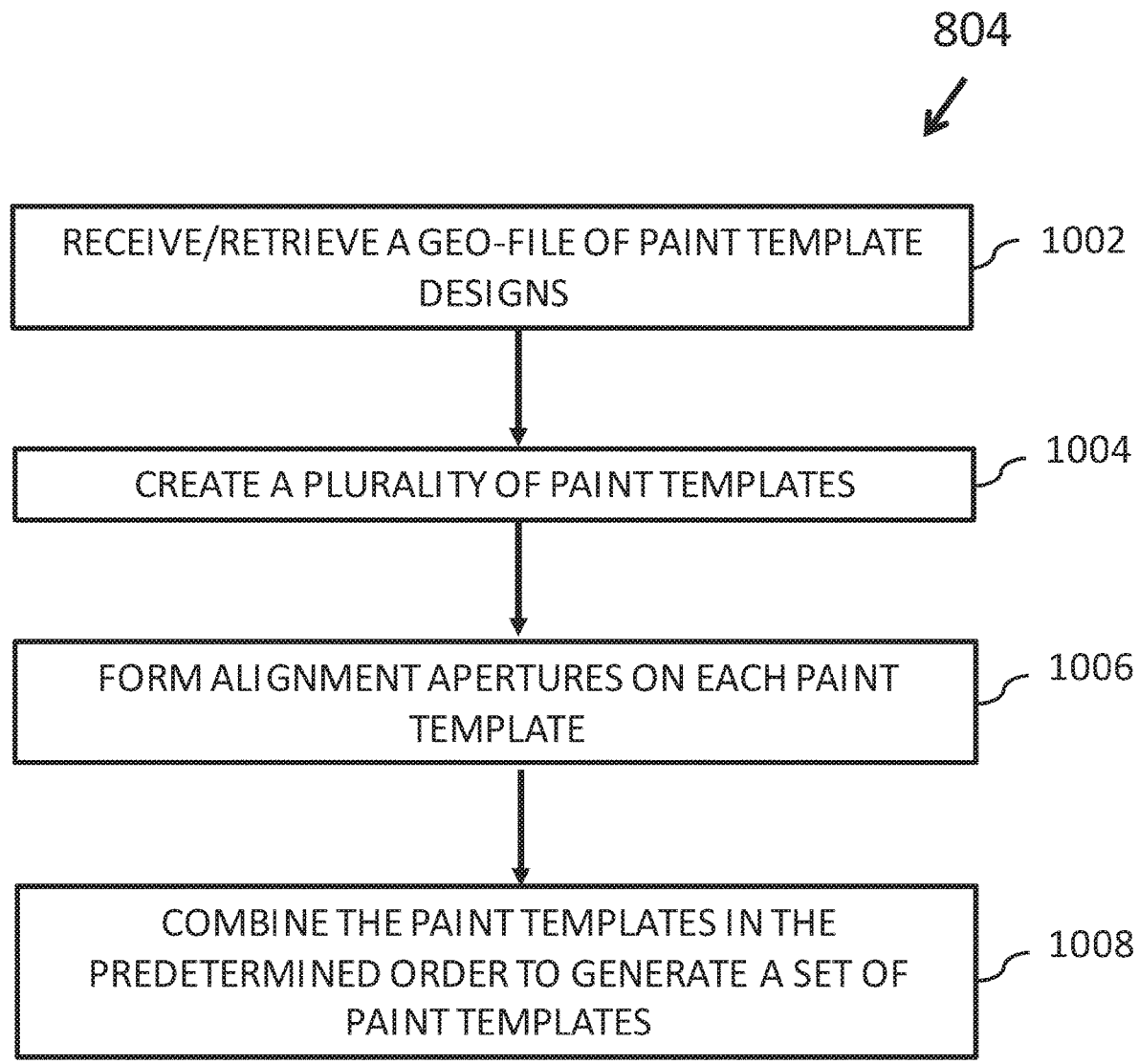
FIG. 10 is a schematic flow diagram of sub-steps of the method of FIG. 8, according to one or more examples of the present disclosure.

With reference to FIGS. 8 through 10, FIGS. 8 through 10 are flow diagrams illustrating various embodiments of a method 800, 802, and 804 for producing and/or facilitating production of paint templates for painting a design on the target surface of a component. Methods 800 through 1000 allow and/or enable more efficient production of a set of paint templates and/or application of a paint design on a target surface because the amount of time utilized to generate alignment marks on the paint template(s) is reduced.

Method 800 (see, e.g., FIG. 8) begins by a processor 210 generating a geo-file of paint template designs 214 based on a set of paint sub-designs 212 (block 802). The generated geo-file of paint template designs 214 includes, in various embodiments, a paint template design that corresponds to a paint sub-design for a design (see, e.g., design 602 (FIG. 6)).

A plotter 104 produces a set of paint templates 514 for the design (block 804). In various embodiments, each paint template in the set of paint templates is based on a corresponding paint template design in the geo-file of paint template designs 214, as discussed elsewhere herein.

In some embodiments, each paint template design includes a set of alignment marks for painting the design on the target surface. Further, each paint template is produced with a set of alignment apertures 702 corresponding to the set of alignment marks on respective paint template design.

In various embodiments, the method 802 (see, e.g., FIG. 9) begins by a processor 210 parsing a design into a set of paint sub-designs 212 (block 902), as discussed elsewhere herein. The processor 210, in some embodiments, orients a set of alignment marks on each respective paint template design in a set of paint template designs (block 904), as discussed elsewhere herein.

In various embodiments, orienting the set of alignment marks on a first paint template design is based on a first geometry for one or more parts in a set of parts associated with a target surface, as discussed elsewhere herein. In additional or alternative embodiments, orienting the set of alignment marks on a second paint template design is based on a second geometry for the set of alignment marks on the first paint template design, as further discussed elsewhere herein.

In other embodiments, orienting the set of alignment marks on a current paint template design is based on a geometry for the set of alignment marks on a previous paint template design. In various embodiments, the set of alignment marks on the current paint template design includes a first alignment mark that is different than a second alignment mark on the previous paint template design.

The method 804 (see, e.g., FIG. 10), in various embodiments, begins by a processor 506 receiving and/or retrieving a geo-file of paint template designs 214 (block 1002). The processor 506, in some embodiments, creates a plurality of paint templates 514 based on the geo-file of paint template designs 214 (block 1004). In various embodiments, each paint template 514 corresponds to a paint template design in the geo-file of paint template designs.

The processor 506, in various embodiments, forms a plurality of alignment apertures on each paint template (block 1006). Each alignment aperture, in some embodiments, corresponds to an alignment mark included in a corresponding paint template design.

In certain embodiments, the processor 506 combines the paint templates to produce a set of paint templates for painting the design on a target surface (block 1008). The processor 506, in some examples, arranges the set of paint templates in the proper/correct order to ensure that the design is accurately painted on the target surface.

In the above description, certain terms may be used such as "up," "down," "upper," "lower," "horizontal," "vertical," "left," "right," "over," "under" and the like. There terms are used, where applicable, to provide some clarity of description when dealing with relative relationships. But, there terms are not intended to imply absolute relationships, positions, and/or orientations. For example, with respect to an object, an "upper" target surface can become a "lower" target surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used here, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of" item A, item B, and item C" may mean item A; item A and item B; item A, item B, and item C; or item B and item C. In some cases, "at least one of item A, item B, and item C" may mean, for example, without limitation, two of item A, one of item B, and ten of item C; four or item B and seven of item C; or some other suitable combination.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any modification, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present technology may be a system, a method, and/or a computer program product. The computer program product may include a computer-readable storage medium (or media) including computer-readable program instructions thereon for causing a processor to carry out aspects of the present technology.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove including instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fibre-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibres, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present technology may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). To perform aspects of the present technology, in some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry.

Aspects of the present technology are described herein with reference to flowchart illustrations and/or block diagrams of methods, apparatus (systems), and computer program products according to embodiments of the technology. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium including instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present technology. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

To more particularly emphasize their implementation independence, many of the functional units described in this specification have been labeled as modules. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program instructions may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The schematic flow chart diagrams included herein are generally set forth as logical flow chart diagrams. As such, the depicted order and labeled steps are indicative of one example of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present subject matter may be embodied in other specific forms without departing from its spirit or essential characteristics. The described examples are to be considered in all respects only as illustrative and not restrictive. All changes that come within the meaning and range of equivalency of the claims are to be embraced within their scope.

What is claimed is:

1. A system for producing paint templates for painting a design on a target surface, comprising:
    an apparatus comprising a processor configured to generate a geo-file of paint template designs, the processor further comprising:
        a design module configured to parse the design into a set of paint sub-designs; and
        a template design module configured to generate the geo-file of paint template designs based on the set of paint sub-designs, the generated geo-file of paint template designs comprising a paint template design that corresponds to a paint sub-design; and
    a plotter coupled to the processor and configured to produce a set of paint templates based on the geo-file of paint template designs, wherein:
        the apparatus further comprises a communication module coupleable to the plotter and configured to transmit the generated geo-file of paint template designs to the plotter;
        each paint template design comprises a set of alignment marks for facilitating painting the paint design on the target surface, and
        each paint template is produced with a set of alignment apertures corresponding to the set of alignment marks for each respective paint template design.

2. The system of claim 1, wherein:
    the template design module is configured to generate the geo-file of paint template designs with a predetermined order for each paint template design relative to other paint template designs; and
    the template design module comprises an alignment module configured to orient the set of alignment marks on each respective paint template design.

3. The system of claim 2, wherein the plotter comprises a cutting component configured to form the set of alignment apertures from each respective paint template based on a corresponding set of alignment marks.

4. The system of claim 2, wherein:
    the alignment module comprises a part geometry module for a set of parts associated with the target surface; and
    the alignment module is configured to orient the set of alignment marks on a first paint template design based on a first geometry for one or more parts in the set of parts associated with the target surface.

5. The system of claim 4, wherein:
    the alignment module further comprises a template geometry module, the template geometry module including geometry data for each paint template design; and
    the alignment module is further configured to orient the set of alignment marks on a second paint template design based on a second geometry for the set of alignment marks on the first paint template design.

6. The system of claim 2, wherein:
    the alignment module further comprises a template geometry module, the template geometry module including geometry data for each paint template design; and
    the alignment module is configured to orient the set of alignment marks on a current paint template design based on a geometry for the set of alignment marks on a previous paint template design.

7. The system of claim 6, wherein the set of alignment marks on the current paint template design comprises a first alignment mark that is different than a second alignment mark on the previous paint template design.

8. An apparatus comprising a processor configured to generate a geo-file of paint template designs for producing paint templates that facilitate painting a design on a target surface, the processor of the apparatus comprising:
    a design module configured to parse a paint design into a set of paint sub-designs;
    a template design module configured to generate the geo-file of paint template designs based on the set of paint sub-designs, the generated geo-file of paint template designs comprising a paint template design that corresponds to a paint sub-design, wherein each paint template design comprises a set of alignment marks for facilitating painting the paint design on the target surface; and
    a communication module coupleable to a plotter and configured to transmit the generated geo-file of paint template designs to the plotter.

9. The apparatus of claim 8, wherein:
    the template design module is configured to generate the geo-file of paint template designs with a predetermined order for each paint template design relative to other paint template designs; and
    the template design module comprises an alignment module configured to orient the set of alignment marks on each respective paint template design.

10. The apparatus of claim 9, wherein:
the alignment module comprises a part geometry module for a set of parts associated with the target surface; and
the alignment module is configured to orient the set of alignment marks on a first paint template design based on a first geometry for one or more parts in the set of parts associated with the target surface.

11. The apparatus of claim 10, wherein:
the alignment module further comprises a template geometry module, the template geometry module including geometry data for each paint template design; and
the alignment module is further configured to orient the set of alignment marks on a second paint template design based on a second geometry for the set of alignment marks on the first paint template design.

12. The apparatus of claim 9, wherein:
the alignment module further comprises a template geometry module, the template geometry module including geometry data for each paint template design; and
the alignment module is configured to orient the set of alignment marks on a current paint template design based on a geometry for the set of alignment marks on a previous paint template design.

13. The apparatus of claim 12, wherein the set of alignment marks on the current paint template design comprises a first alignment mark that is different than a second alignment mark on the previous paint template design.

14. A method for producing paint templates for painting a design on a target surface, comprising:
generating, by a processor, a geo-file of paint template designs based on a set of paint sub-designs, the generated geo-file of paint template designs comprising a paint template design that corresponds to a paint sub-design for the design on the target surface; and
producing, by a plotter, a set of paint templates based on the geo-file of paint template designs, wherein:
each paint template design comprises a set of alignment marks for facilitating painting the design on the target surface, and
each paint template is produced with a set of alignment apertures corresponding to the set of alignment marks for each respective paint template design.

15. The method of claim 14, wherein the step of generating the geo-file of paint template designs comprises:
parsing, by the processor, the design into the set of paint sub-designs;
orienting the set of alignment marks on each respective paint template design; and
combining a plurality of paint template designs in a predetermined order relative to each other to generate the geo-file of paint template designs.

16. The method of claim 15, wherein the step of orienting the set of alignment marks on a first paint template design is based on a first geometry for one or more parts in a set of parts associated with the target surface.

17. The method of claim 16, wherein the step of orienting the set of alignment marks on a second paint template design is based on a second geometry for the set of alignment marks on the first paint template design.

18. The method of claim 15, wherein the step of orienting the set of alignment marks on a current paint template design is based on a geometry for the set of alignment marks on a previous paint template design.

19. The method of claim 18, wherein the set of alignment marks on the current paint template design comprises a first alignment mark that is different than a second alignment mark on the previous paint template design.

20. The method of claim 14, wherein the step of producing the set of paint templates comprises forming the set of alignment apertures from each respective paint template based on the corresponding set of alignment marks.

* * * * *